(12) United States Patent
Shieh et al.

(10) Patent No.: US 8,795,540 B2
(45) Date of Patent: Aug. 5, 2014

(54) SELECTIVE BIAS COMPENSATION FOR PATTERNING STEPS IN CMOS PROCESSES

(75) Inventors: Ming-Feng Shieh, Yongkang (TW); Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 172 days.

(21) Appl. No.: 13/335,618

(22) Filed: Dec. 22, 2011

(65) Prior Publication Data
US 2013/0164938 A1  Jun. 27, 2013

(51) Int. Cl.
*C03C 15/00* (2006.01)
*H01L 21/033* (2006.01)

(52) U.S. Cl.
CPC ................... *H01L 21/0337* (2013.01)
USPC .......................................................... 216/41

(58) Field of Classification Search
None
See application file for complete search history.

(56) References Cited

U.S. PATENT DOCUMENTS

| | | | |
|---|---|---|---|
| 6,566,280 B1* | 5/2003 | Meagley et al. | 438/780 |
| 2010/0119982 A1* | 5/2010 | Sho | 430/319 |
| 2010/0266952 A1* | 10/2010 | Kashiwamura et al. | 430/270.1 |

* cited by examiner

*Primary Examiner* — Duy Deo
*Assistant Examiner* — Bradford Gates
(74) *Attorney, Agent, or Firm* — Slater and Matsil, L.L.P.

(57) ABSTRACT

A method includes forming a photo resist pattern, and performing a light-exposure on a first portion of the photo resist pattern, wherein a second portion of the photo resist pattern is not exposed to light. A photo-acid reactive material is coated on the first portion and the second portion of the photo resist pattern. The photo-acid reactive material reacts with the photo resist pattern to form a film. Portions of the photo-acid reactive material that do not react with the photo resist pattern are then removed, and the film is left on the photo resist pattern.

19 Claims, 18 Drawing Sheets

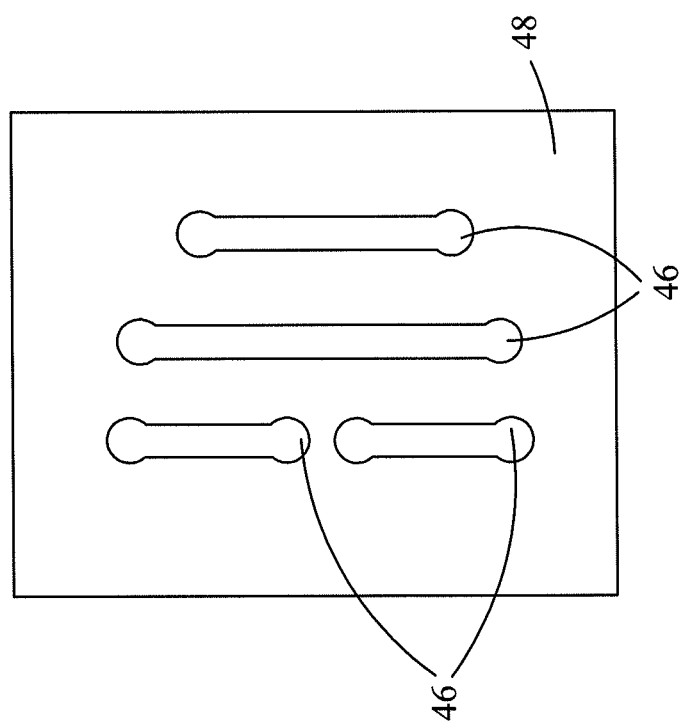

SELECTIVE BIAS COMPENSATION FOR PATTERNING STEPS IN CMOS PROCESSES

BACKGROUND

In the formation of integrated circuits, the components of the integrated circuits need to be patterned to form desirable shapes. A typical patterning process includes forming a photo resist, exposing the photo resist using a lithography mask, patterning the photo resist, and using the patterned photo resist to etch a layer underlying the photo resist. As a result, the layout of the patterned photo resist is transferred to the underlying layers. The photo resist is then removed.

In the patterning of photo resists, various factors, such as optical proximity effect, may cause the patterns of the photo resists to deviate from the patterns in the respective lithography masks. The deviation may be referred to as a bias. In certain locations such as at the line ends of the photo resist lines, the bias is more significant than in other places. The non-uniformity of the bias cause problems for the integrated circuit manufacturing processes.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 7 through 15 are cross-sectional views and top views of intermediate stages in the patterning processes in accordance with alternative exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Patterning processes are provided in accordance with various exemplary embodiments, wherein the biases in the patterning processes are compensated for. The intermediate stages for forming the photo resist patterns, which are used in the patterning of the underlying features, are illustrated in accordance with exemplary embodiments. The variations of the embodiments are discussed. Throughout the various views and illustrative embodiments, like reference numbers are used to designate like elements.

Figure 1:
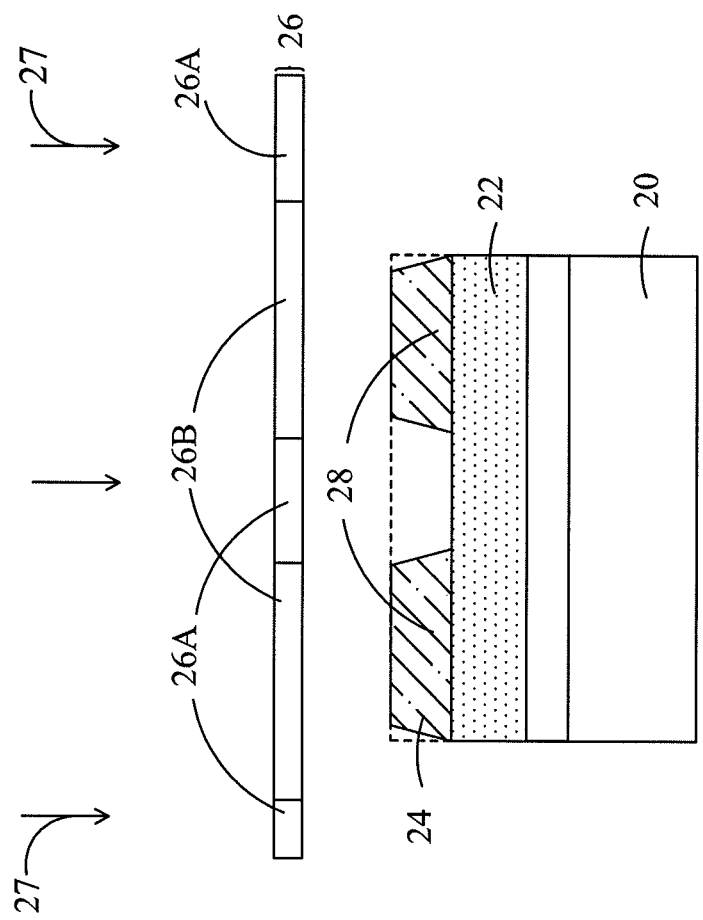
FIGS. 1 through 6 are cross-sectional views and top views of intermediate stages in the patterning processes in accordance with some exemplary embodiments.

FIGS. 1 through 6 illustrate cross-sectional views and top views in the formation of integrated circuit components in accordance with some exemplary embodiments. Referring to FIG. 1, substrate 20 is provided. Substrate 20 may be a semiconductor substrate, for example, a silicon substrate. Layer 22 is formed over substrate 20, and is the layer that is to be patterned. In some exemplary embodiments, layer 22 may be used for forming various types of integrated circuit components, including, and not limited to, dielectric regions, conductive regions, gate electrodes and gate dielectrics, vias, and the like. In other embodiments, the subsequently formed photo resist patterns are for forming integrated circuit components in substrate 20, which components may include well regions, diffusion regions, shallow trench isolation regions, or the like. Accordingly, in these embodiments, layer 22 is not formed, and the subsequently applied photo resist 24 may be applied on substrate 20.

In some embodiments, photo resist 24 is applied over layer 22 as a blanket layer. Lithography mask 26 is then used to expose photo resist 24. Lithography mask 26 includes transparent portions 26A that allows light to penetrate through, and opaque portions 26B that block the light. After the exposure of photo resist 24 using light 27, portions of photo resist 24 are removed, and the remaining portions of photo resist 24 are left un-removed. The remaining portions of photo resist 24 are referred to as photo resist patterns 28 hereinafter. In some exemplary embodiments, the portions of photo resist 24 that are exposed to light 27 are removed, while the unexposed portions of photo resist 24 are not removed. In alternative embodiments, the portions of photo resist 24 that are not exposed to light 27 are removed, while the exposed portions of photo resist 24 are not removed. Photo resist patterns 28 may be photo resist strips that have the respective lengths significantly greater than the respective widths.

Figure 2:
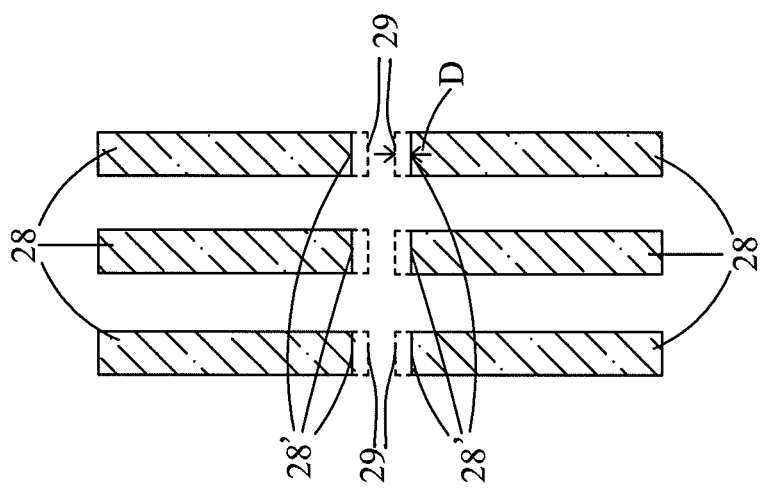

FIG. 2 illustrates a top view of some exemplary photo resist patterns 28, which have the shapes of lines/strips. The line ends of some of photo resist patterns 28 may face the line ends of some other photo resist patterns 28. Due to the lithography effects, the line ends of photo resist patterns 28 may recess from desirable positions. For example, dashed lines 29 represent the desirable positions of the line ends of photo resist patterns 28, wherein the desirable positions are also the interfaces between the transparent portions 26A (not shown in FIG. 2, please refer to FIG. 1) and opaque portions 26B of lithography mask 26. The actual positions of the line ends of photo resist patterns 28, however, are recessed from dashed lines 29. Distance D between desirable positions 29 and actual positions 28' are referred to as patterning bias.

Figure 3A:
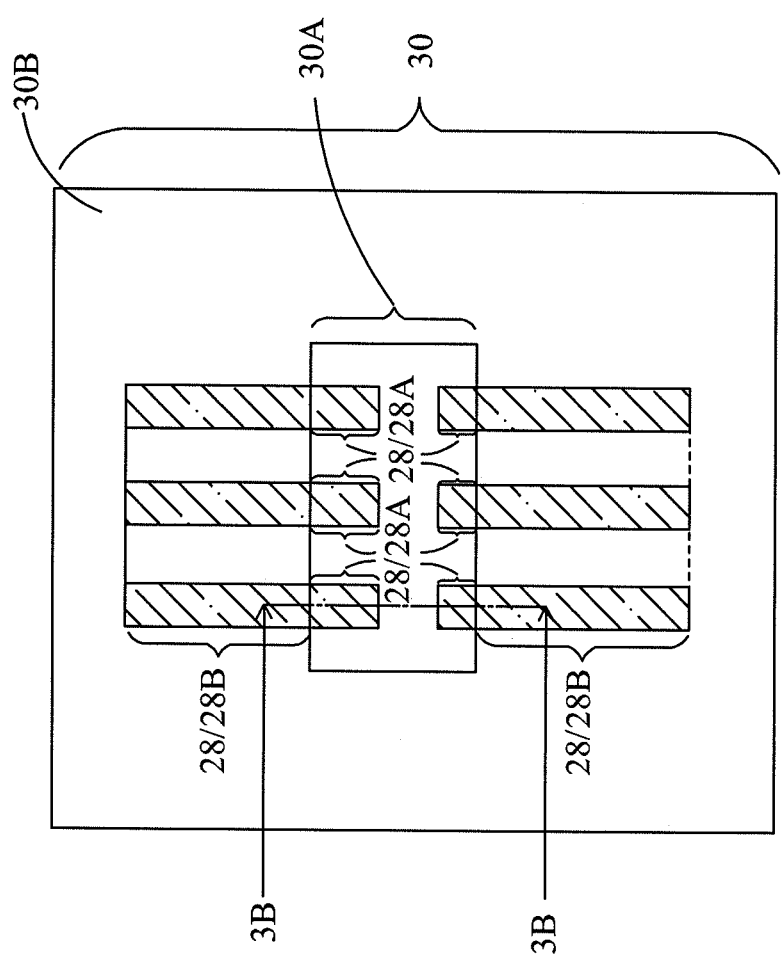

Referring to FIG. 3A, which is a top view, lithography mask 30 is placed over photo resist patterns 28. In the illustrated exemplary embodiments, some line-end portions (referred to as Photo Resist (PR) portions 28A hereinafter) of photo resist patterns 28 overlap the transparent patterns 30A of lithography mask 30. Some other portions (referred to as PR portions 28B hereinafter) of photo resist patterns 28 overlap the opaque patterns 30B of lithography mask 30. In some embodiments, PR portions 28A include all line end portions of photo resist patterns 28. PR portions 28B may include the middle portions of photo resist patterns 28.

Figure 3B:
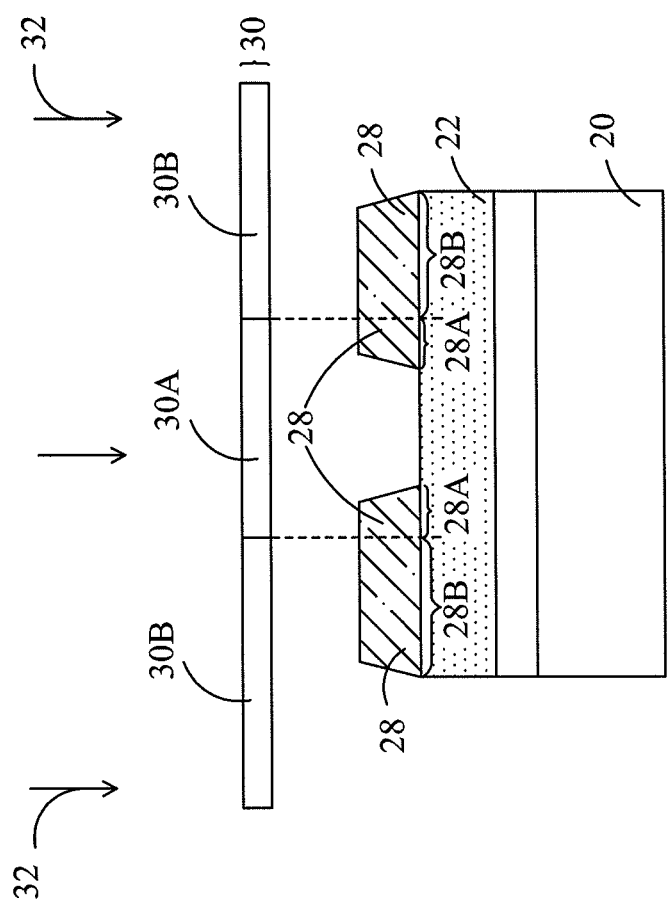

FIG. 3B illustrates a cross-sectional view of the structure shown in FIG. 3A, wherein the cross-sectional view is obtained from the plane crossing line 3B-3B in FIG. 3A. A light exposure is performed by projecting light 32 to photo resist patterns 28 through lithography mask 30. Accordingly, PR portions 28A are exposed to light 32. Since the opaque portions 30B of lithography mask 30 block light 32, PR portions 28B are not exposed to light 32. As a result of the light exposure, photo acid is generated in PR portions 28A. It is realized that before exposing to light 32, PR portions 28A and 28B may, or may not, include photo-acid therein. The exposure of PR portions 28A causes the generation of additional photo acid in PR portions 28A. As a result, the photo acid concentration in PR portions 28A is increased to higher than the photo acid concentration in PR portions 28B.

Figure 4:
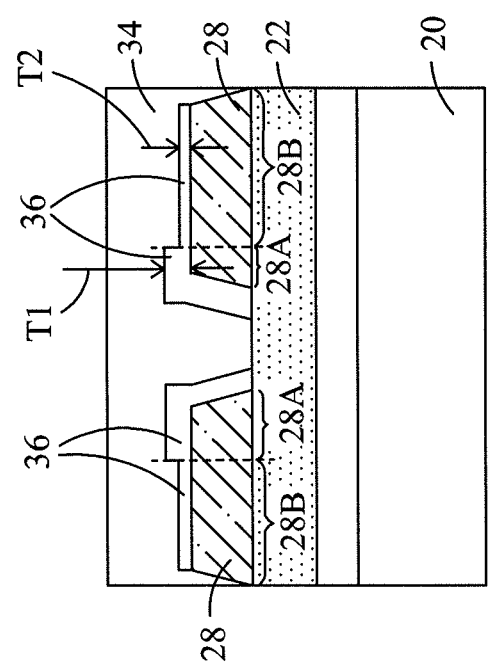

Referring to FIG. 4, photo-acid reactive material 34 is coated on photo resist patterns 28. Photo-acid reactive material 34 is in contact with the top surface and the sidewalls of PR portions 28A and PR portions 28B. In some embodiments, photo-acid reactive material 34 comprises a polymer. Photo-acid reactive material 34 may also include a quencher to quench the photo acid in photo resist patterns 28. In addition, photo-acid reactive material 34 may include additional materials such as silicon filler. The additional materials may have the functions such as controlling the dimension (critical dimension) of the resulting film 36, and improving etching selectivity. In an exemplary embodiment, the polymer in photo-acid reactive material 34 comprises Resist Enhancement Lithography Assisted Chemical Shrink (RELACE), which is manufactured by Clariant Corporation. In alternative embodiments, the shrink polymer material may further include cross linker, quencher, Si, surfactant, Thermal Acid Generator (TAG), and/or the like.

A baking process is then performed. In some exemplary embodiments, the baking may be performed for a period of time between about 30 seconds and about 3.0 minutes. The temperature of the baking may be between about 23° C. and about 200° C., or may be between about 100° C. and about 130° C. During the baking process, photo-acid reactive material 34 reacts with the photo acid in PR portions 28A, so that film 36 is formed on the top surface and the sidewalls of PR portions 28A. In accordance with some embodiments, film 36 is not soluble in water. Since PR portions 28B may also include photo acid, film 36 may also be formed on the surface and sidewalls of PR portions 28B. In the embodiments wherein PR portions 28B do not include photo acid, substantially no film 36 is formed on PR portions 28B. Since the concentration of the photo acid, if any, in PR portions 28B, is lower than the concentration of the photo acid in PR portions 28A, thickness T2 of film 36 on PR portions 28B is smaller than thickness T1 of film 36 on PR portions 28A. In some exemplary embodiments, thickness T2 is smaller than about 95 percent thickness T1. Thickness T1 may be increased by increasing the light exposure of PR portions 28A in the step shown in FIGS. 3A and 3B. After the reaction, un-reacted portions of photo-acid reactive material 34 are removed. In some exemplary embodiments, the un-reacted portions of photo-acid reactive material 34 are dissolved in water. Film 36 is left un-removed since it is not soluble in water.

Figure 5:
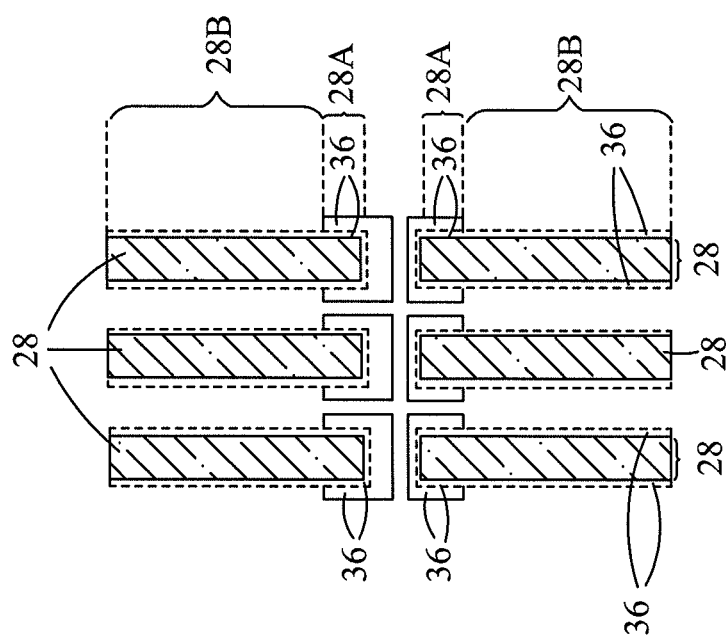

Referring to FIG. 5, which is a top view, after the reaction and the removal of the unreacted portions of photo-acid reactive material 34, the resulting patterns include photo resist patterns 28 and film 36. The sizes of the combined patterns of photo resist patterns 28 and film 36 are increased over the sizes of photo patterns 28. The enlargement of the patterns is in lateral directions parallel to the major surface of substrate 20 (FIG. 4). The increase in size adjacent to PR portions 28A is greater than the increase adjacent to PR portions 28B. Since PR portions 28A are the line-end portions, the greater increase compensates for, at least partially, the line-end bias D (FIG. 2) in the formation of photo resist patterns 28, which bias is generated in the step shown in FIGS. 1 and 2. In some embodiments, by adjusting the amount of quencher in photo-acid reactive material 34 (FIG. 4), thicknesses T1 and T2 of film 36 (please refer to FIG. 4) may be adjusted, and the amount of compensation to the bias D may be adjusted.

Figure 6:
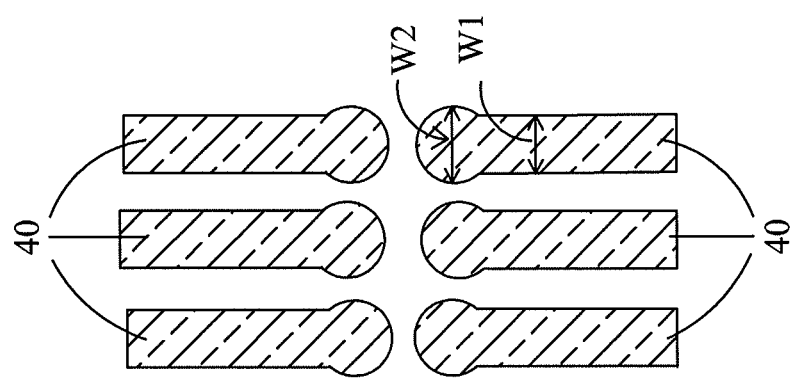

Photo resist patterns 28 and film 36 in combination are used as an etching mask, so that the underlying layer 22 (FIG. 4) may be patterned. FIG. 6 schematically illustrates a top view of the resulting patterns 40, which may be the remaining portions (after the patterning) of layer 22 as shown in FIG. 4. Line-end portions of patterns 40 may have width W2, which is greater than width W1 of the middle portions of patterns 40. In some exemplary embodiments, width W2 may be greater than with W1 by about 5 percent, or by about 50 percent. Accordingly, the increased size of the patterning mask (including PR patterns 28 and film 36) is transferred to the underlying patterns 40.

In the above-discussed embodiments, each of photo resist patterns 28 has one end illustrated, and the other end is not illustrated. It is noted that the other end of each, or some, of photo resist patterns 28 may also be exposed during the step (FIGS. 3A and 3B) that the illustrated ends of photo resist patterns 28 are exposed to light. Accordingly, film 36 that has thickness T2 (FIG. 4) is also formed on the un-illustrated ends of photo resist patterns 28.

FIGS. 7A through 15 illustrate cross-sectional views and top views of intermediate stages in the formation of some patterns in accordance with alternative embodiments. Unless specified otherwise, the materials and formation methods of the components in these embodiments are essentially the same as the like components, which are denoted by like reference numerals in the embodiment shown in FIGS. 1 through 6. The formation details of the embodiment shown in FIGS. 7A through 15 may thus be found in the embodiments shown in FIGS. 1 through 6.

Figure 7A:
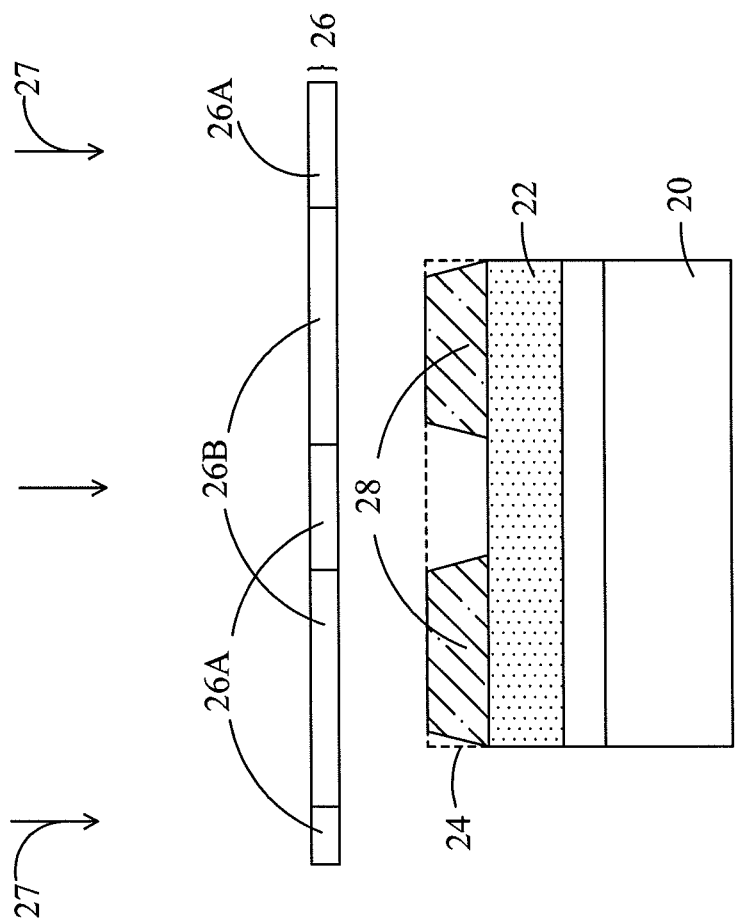
Figure 7B:
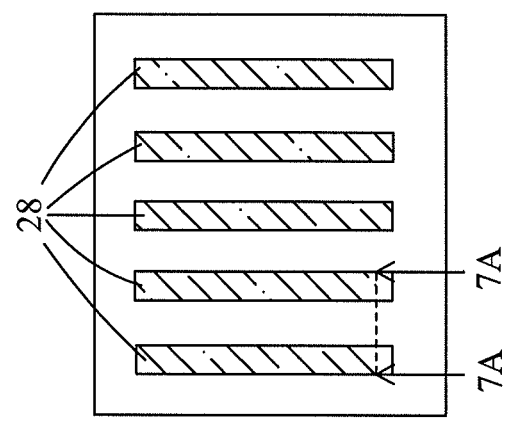

Referring to FIG. 7A, photo resist patterns 28 are formed. In accordance with some exemplary embodiments, the formation of photo resist patterns 28 include applying blanket photo resist layer 24, exposing photo resist layer 24 using lithography mask 26, and removing portions of photo resist layer 24. The remaining portions of photo resist layer 24 thus form photo resist patterns 28. FIG. 7B illustrates a top view of photo resist patterns 28. The cross-sectional view in FIG. 7A is obtained from the plane crossing line 7A-7A in FIG. 7B.

Figure 8A:
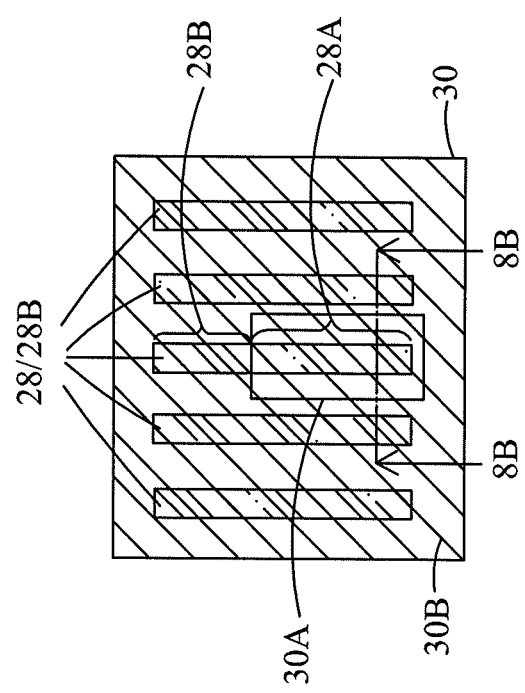
Figure 8B:
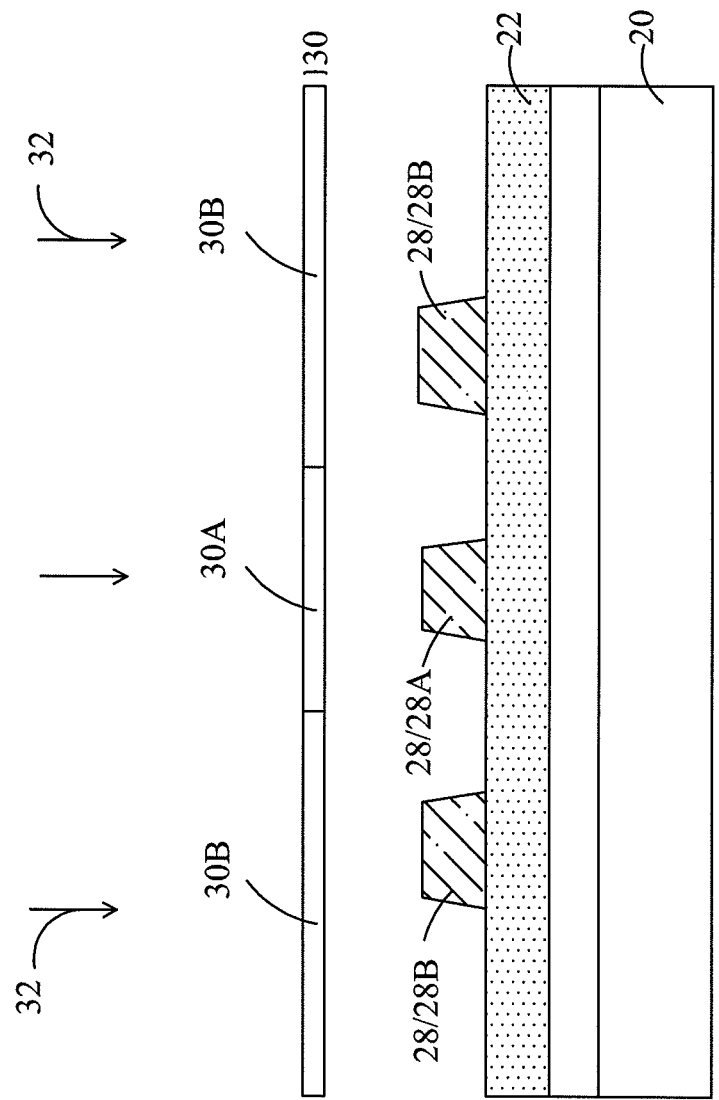

FIGS. 8A and 8B illustrate a top view and a cross-sectional view, respectively, in the exposing of a portion of photo resist patterns 28. The cross-sectional view in FIG. 8B is obtained from the plane crossing line 8B-8B in FIG. 8A. Lithography mask 30 is placed over photo resist patterns 28. PR portion 28A of one of photo resist patterns 28 overlaps transparent portion of lithography mask 30, and PR portions 28B overlap the opaque portions of lithography mask 30. As shown in FIG. 8B, portion 28A receives the exposure from light 32, and hence more photo acid is generated in portion 28A. PR portions 28B accordingly have a photo-acid concentration lower than the photo-acid concentration in PR portion 28A.

Figure 9:
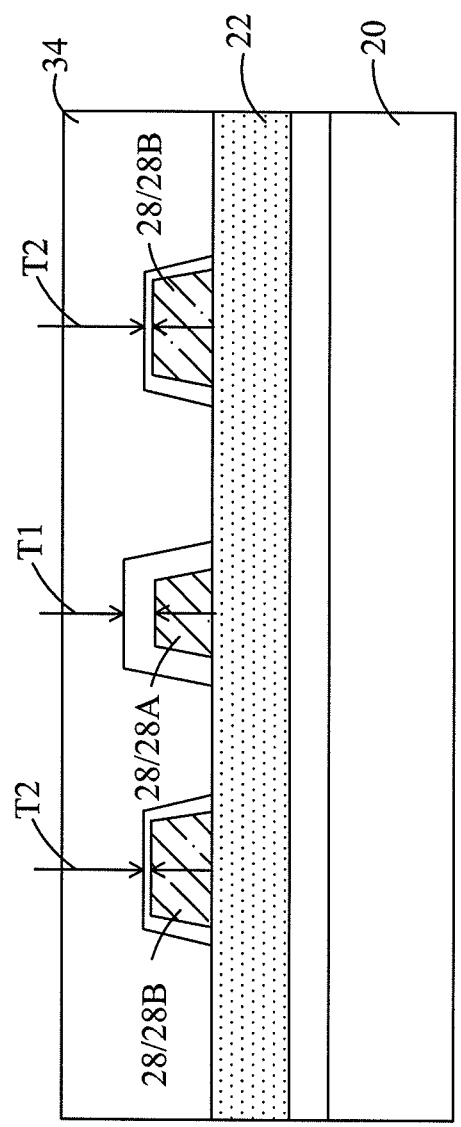

Next, as shown in FIG. 9, photo-acid reactive material 34 is coated on PR portions 28A and 28B. A baking process is performed to form film 36 through the reaction of photo-acid reactive material 34 and the photo acid. Thickness T2 of film 36 on PR portions 28B is smaller than thickness T1 of film 36 on PR portion 28A. The un-reacted portions of photo-acid reactive material 34 are then removed. It is observed that the portions of film 36 on opposite sidewalls of PR portion 28A have substantially the same thickness. Accordingly, the increase in the size of the resulting etching mask, which includes PR portion 28A and film 36, is self aligned to the position of PR portion 28A.

Figure 10:
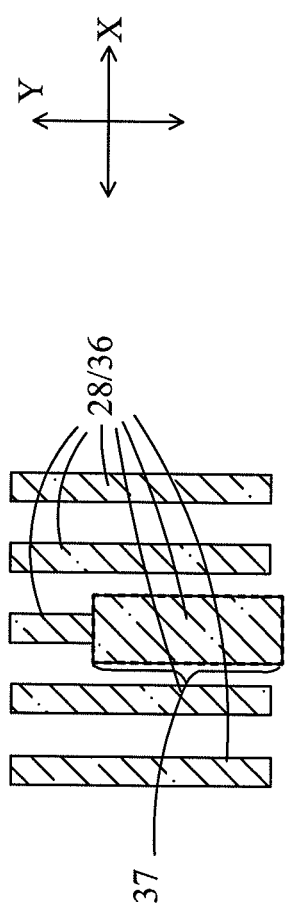

FIG. 10 illustrates a top view of the resulting pattern, which includes film 36 and photo resist patterns 28 underlying film 36. One of the etching mask patterns in FIG. 10 now includes a narrow portion and wide portion 37. Next, PR portions 28A and 28B and film 36 as shown in FIG. 10 are used as an etching mask to form patterns 40 as in FIG. 11, for example, by etching layer 22 in FIG. 7A. Patterns 40 are the remaining portions of layer 22.

Figure 11:
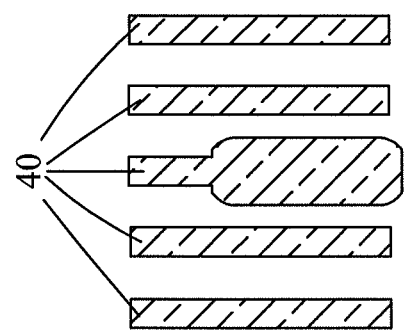

In conventional processes, the formation of the wide portion of patterns 40 in FIG. 11 may need to be achieved through double patterning processes. The double patterning process, however, suffer from overlay misalignment since the patterns generated in the two patterning processes may not be aligned accurately. When photo resist patterns are very close to each other, the misalignment of the patterns generated in two patterning processes may cause a significant impact on the performance and the yield of the integrated circuit. The formation of the wide pattern 37 in FIG. 10 in accordance with embodiments, however, is self-aligned in the X direction. Although there may be misalignment in the Y direction, and wide portion 37 may not be accurately positioned in the Y direction, the misalignment in the Y direction has a smaller impact than the misalignment in the X direction.

Figure 12:
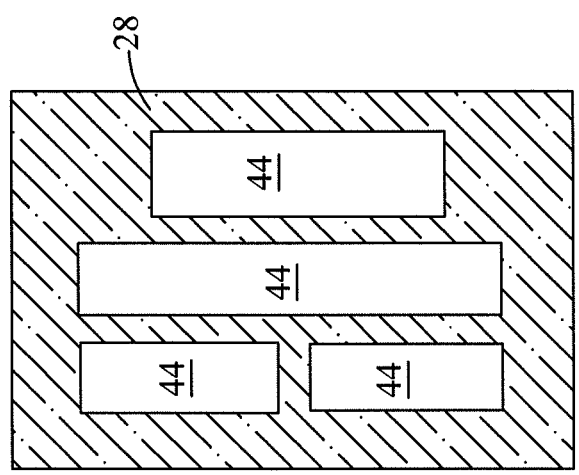

FIGS. 12 through 15 illustrate the top views of intermediate stages in the formation of trenches. Referring to FIG. 12, photo resist 28 is formed and patterned, and trenches 44 are formed in photo resist 28. Next, referring to FIG. 13, lithography mask 30 is placed over photo resist 28. The shaded portions of lithography mask 30 represent the opaque portions 30B that block light, while the non-shaded portion 30A of the lithography mask 30 represents the transparent portion. In some exemplary embodiments, opaque portions 30B overlap one end portion or both end portions of each of trenches 44. Opaque portions 30B also overlap PR portions 28B that surround the end portions of trenches 44. Transparent portion 30A of lithography mask 30 overlaps the remaining portion of the pattern shown in FIG. 12. For example, the transparent portion 30A of lithography mask 30 may overlap the middle portions of each of trenches 44 and PR portions 28A on opposite sides of the middle portions of trenches 44. Next, light 32 is projected to expose PR portions 28A, and PR portions 28B are not exposed. Lithography mask 30 is then taken away.

Figure 13:
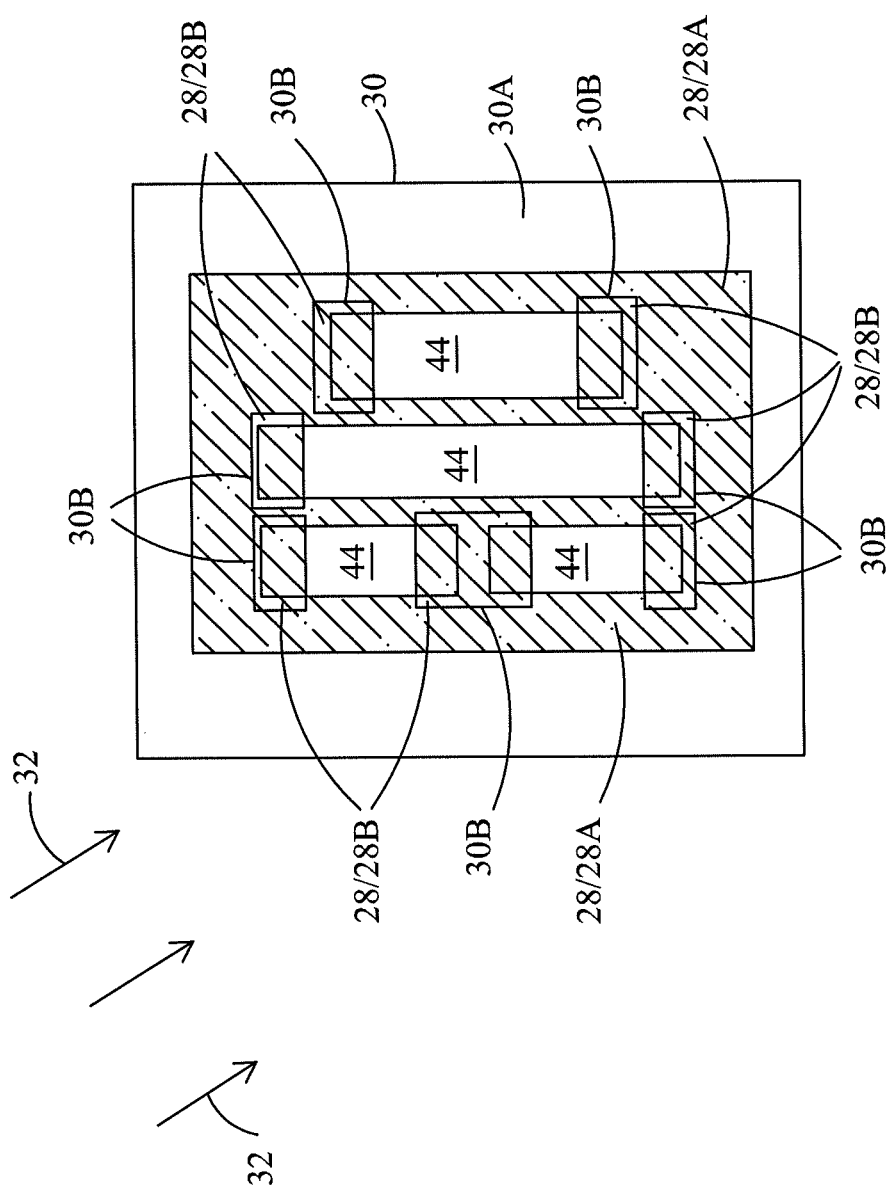
Figure 14:
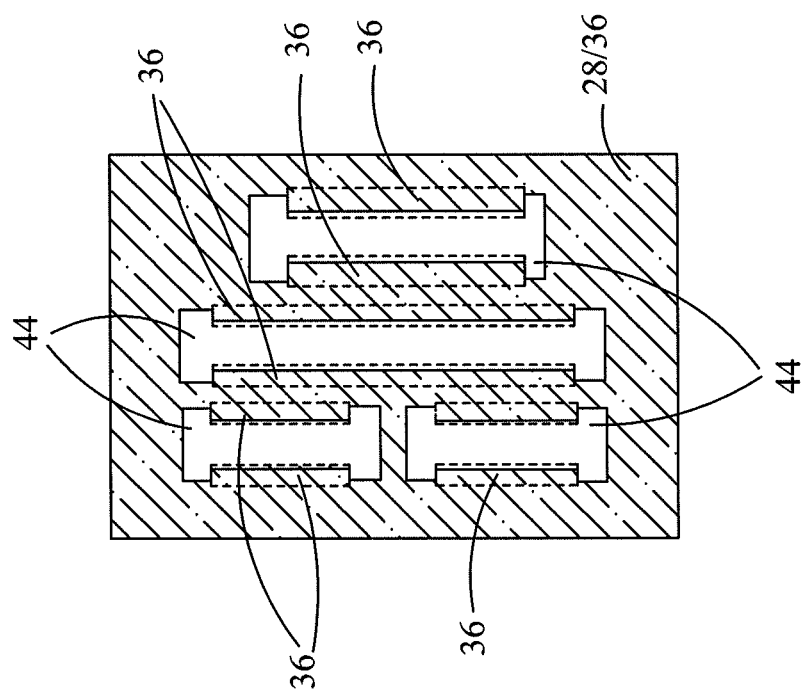

In subsequent steps, photo-acid reactive material 34 (not shown, similar to what is shown in FIG. 4) is coated on the structure shown in FIG. 13, so that photo-acid reactive material 34 is in contact with PR portions 28A and PR portions 28B as in FIG. 13. After a baking process, film 36 is formed. FIG. 14 illustrates a top view of the combined patterns of photo resist 28 and film 36. It is observed that at the middle portions of trenches 44, more film 36 is formed, and hence the resulting trenches 44 become narrower at the middle portions. The portions of trenches 44 are wider than at the ends.

FIG. 15 illustrates a top view of trenches 46 formed in layer 48 that is under photo resist patterns 28. Photo resist patterns 28 and film 36 in FIG. 14 is used as the etching mask for etching layer 48. Accordingly, the patterns of trenches 44 in FIG. 14 are transferred to the trenches 46 in layer 48. In some embodiments, layer 48 may be a dielectric layer, and trenches 46 may be used to form metal lines, metal gates, or the like, in dielectric layer 48, wherein damascene processes may be used to fill the metal into trenches 46. Since at the line ends, the patterning bias for etching layer 48 is more significant, the trench pattern shown in FIG. 14 may compensate for the increased bias at the ends of trenches 46. The reason is that the middle portions of trenches typically have smaller biases. Accordingly, as shown in FIG. 14, the middle portion of trenches 44 is narrowed in accordance with embodiments. This is equivalent to widening the end portions.

In accordance with embodiments, portions of masks such as photo resists may be selectively enlarged. Accordingly, the line-end bias may be compensated for. The methods in accordance with embodiments may also be used to form patterns that otherwise need to be formed using double patterning techniques.

In accordance with embodiments, a method includes forming a photo resist pattern, and performing a light-exposure on a first portion of the photo resist pattern, wherein a second portion of the photo resist pattern is not exposed to light. A photo-acid reactive material is coated on the first portion and the second portion of the photo resist pattern. The photo-acid reactive material reacts with the photo resist pattern to form a film. Portions of the photo-acid reactive material that do not react with the photo resist pattern are then removed, and the film is left on the photo resist pattern.

In accordance with other embodiments, a method includes forming a photo resist pattern over a layer, increasing a photo-acid concentration of a photo acid in a first portion of the photo resist pattern, wherein a second photo-acid concentration of the photo acid in a second portion of the photo resist pattern is substantially not increased. A polymer is coated on the first portion and the second portion of the photo resist pattern. The polymer and the photo resist pattern are then baked, wherein the photo acid in the photo resist pattern reacts with the polymer to form a film. A first portion of the film overlapping the first portion of the photo resist pattern has a first thickness, and a second portion of the film overlapping the second portion of the photo resist pattern has a second thickness smaller than the first thickness. Portions of the polymer that do not react with the photo resist pattern are removed. The first portion and the second portion of the photo resist pattern and the film are used as an etching mask to etch the layer under the photo resist pattern.

In accordance with yet other embodiments, a method includes applying a photo resist over a substrate, exposing the photo resist in a first photo resist exposing step, developing the photo resist to form a photo resist strip, and exposing an end portion of the photo resist strip in a second photo resist exposing step. A middle portion of the photo resist strip is not exposed. After the second photo resist exposing step, a photo-acid reactive material is coated on the end portion and the middle portion of the photo resist strip, wherein the photo-acid reactive material contacts a sidewall of the photo resist strip. The photo-acid reactive material and the photo resist strip are baked, wherein the photo-acid in the photo resist strip reacts with the photo-acid reactive material to form a film that is not soluble in water. Portions of the photo-acid reactive material that do not react with the photo resist strip are then dissolved in water, and the film is not dissolved in the water.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A method comprising:
  forming a photo resist pattern, wherein the photo resist pattern has a strip-shaped trench therein, with the strip-shaped trench encircled by the photo resist pattern, and wherein the strip-shaped trench comprises a middle portion, and end portions on opposite ends of the middle portion;

performing a light-exposure on a first portion of the photo resist pattern, wherein a second portion of the photo resist pattern is not exposed to light, wherein the first portion of the photo resist pattern comprises portions of the photo resist pattern on opposite sides of the middle portion, and wherein the second portion comprises portions of the photo resist pattern that have edges exposed to the end portions of the strip-shaped trench;

coating a photo-acid reactive material on the first portion and the second portion of the photo resist pattern;

reacting the photo-acid reactive material with the photo resist pattern to form a film; and removing portions of the photo-acid reactive material that do not react with the photo resist pattern, wherein the film is left on the photo resist pattern.

2. The method of claim 1 further comprising using the photo resist pattern and the film as an etching mask to etch a layer under the photo resist pattern, wherein a portion of the layer directly under the trench is removed to form a trench in the layer.

3. The method of claim 1, wherein the step of reacting the photo-acid reactive material with the photo resist pattern comprises baking the photo-acid reactive material and the photo resist pattern.

4. The method of claim 1 further comprising using the photo resist pattern and the film as an etching mask to etch a layer under the photo resist pattern.

5. The method of claim 1, wherein the photo-acid reactive material comprises Resist Enhancement Lithography Assisted Chemical Shrink (RELACS).

6. The method of claim 1, wherein the photo-acid reactive material comprises a quencher for quenching a photo acid in the photo resist pattern.

7. The method of claim 1, wherein portions of the photo resist patterned receiving the light-exposure does not comprise end portions of the photo resist pattern aligned to a middle line of the strip-shaped trench.

8. A method comprising:
    forming a photo resist pattern over a layer, wherein the photo resist pattern has a strip-shaped trench therein, with the strip-shaped trench encircled by the photo resist pattern, and wherein the strip-shaped trench comprises a middle portion, and end portions on opposite ends of the middle portion;

increasing a photo-acid concentration of a photo acid in a first portion of the photo resist pattern, wherein a second photo-acid concentration of the photo acid in a second portion of the photo resist pattern is substantially not increased, wherein the first portion comprises portions of the photo resist pattern on opposite sides of the middle portion, and wherein the second portion comprises portions of the photo resist pattern that have edges exposed to the end portions of the strip-shaped trench;

coating a polymer on the first portion and the second portion of the photo resist pattern;

baking the polymer and the photo resist pattern, wherein the photo acid in the photo resist pattern reacts with the polymer to form a film, wherein a first portion of the film overlapping the first portion of the photo resist pattern has a first thickness, and wherein a second portion of the film overlapping the second portion of the photo resist pattern has a second thickness smaller than the first thickness;

removing portions of the polymer that do not react with the photo resist pattern; and using the first portion and the second portion of the photo resist pattern and the film as an etching mask to etch the layer under the photo resist pattern.

9. The method of claim 8, wherein the step of increasing the photo-acid concentration comprises exposing the first portion of the photo resist pattern to a light, wherein the second portion of the photo resist pattern is not exposed to the light.

10. The method of claim 8, wherein the film is formed on a top surface and sidewalls of the first portion of the photo resist pattern.

11. The method of claim 8, wherein the step of removing the portions of the polymer that are not reacted with the photo resist pattern is performed using water to resolve the portions of the polymer.

12. The method of claim 8, wherein portions of the photo resist patterned with the increasing a photo-acid concentration increased does not comprise end portions of the photo resist pattern aligned to a middle line of the strip-shaped trench.

13. The method of claim 8, wherein the polymer comprises a photo-acid reactive material.

14. The method of claim 13, wherein the photo-acid reactive material comprises a Resist Enhancement Lithography Assisted Chemical Shrink (RELACS) and a quencher.

15. A method comprising:
    forming a photo resist pattern, wherein the photo resist pattern has a strip-shaped trench therein, with the strip-shaped trench encircled by the photo resist pattern, and wherein the strip-shaped trench comprises a middle portion, and end portions on opposite ends of the middle portion;

performing a light-exposure on a first portion of the photo resist pattern, wherein a second portion of the photo resist pattern is not exposed to light, wherein the first portion of the photo resist pattern comprises portions of the photo resist pattern on opposite sides of the middle portion, wherein the end portions of the photo resist pattern aligned to a middle line of the strip-shaped trench does not receive the light-exposure, and wherein the second portion comprises portions of the photo resist pattern that have edges exposed to the end portions of the strip-shaped trench;

coating a photo-acid reactive material on the first portion and the second portion of the photo resist pattern;

reacting the photo-acid reactive material with the photo resist pattern to form a film;

removing portions of the photo-acid reactive material that do not react with the photo resist pattern, wherein the film is left on the photo resist pattern; and etching a layer under the photo resist pattern using the photo resist pattern and the film as an etching mask.

16. The method of claim 15 further comprising using the photo resist pattern and the film as an etching mask to etch a layer under the photo resist pattern, wherein a portion of the layer directly under the trench is removed to form a trench in the layer.

17. The method of claim 15, wherein the step of reacting the photo-acid reactive material with the photo resist pattern comprises baking the photo-acid reactive material and the photo resist pattern.

18. The method of claim 15, wherein the photo-acid reactive material comprises Resist Enhancement Lithography Assisted Chemical Shrink (RELACS).

19. The method of claim 15, wherein the photo-acid reactive material comprises a quencher for quenching a photo acid in the photo resist pattern.

* * * * *